(12) United States Patent  
Adkisson et al.

(10) Patent No.: US 9,312,370 B2  
(45) Date of Patent: Apr. 12, 2016

(54) BIPOLAR TRANSISTOR WITH EXTRINSIC BASE REGION AND METHODS OF FABRICATION

(71) Applicant: GLOBALFOUNDRIES INC., Grand Cayman, KY (US)

(72) Inventors: James W. Adkisson, Jericho, VT (US); David L. Harame, Essex Junction, VT (US); Michael L. Kerbaugh, Williston, VT (US); Qizhi Liu, Lexington, MA (US); John J. Pekarik, Underhill, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/300,944

(22) Filed: Jun. 10, 2014

(65) Prior Publication Data

US 2015/0357447 A1 Dec. 10, 2015

(51) Int. Cl.
*H01L 29/73* (2006.01)
*H01L 29/732* (2006.01)
*H01L 29/66* (2006.01)
*H01L 29/10* (2006.01)

(52) U.S. Cl.
CPC .......... *H01L 29/732* (2013.01); *H01L 29/1004* (2013.01); *H01L 29/66287* (2013.01)

(58) Field of Classification Search
CPC ............ H01L 29/732; H01L 29/66287; H01L 29/1004; H01L 27/66287
USPC ......... 438/309, 347–350, 364, 734, 739, 696; 257/586
See application file for complete search history.

(56) References Cited

U.S. PATENT DOCUMENTS

| 4,967,252 | A  | * | 10/1990 | Awano .......................... 257/197 |
| 5,087,580 | A  |   | 2/1992  | Eklund |
| 5,665,614 | A  | * | 9/1997  | Hafizi et al. .................. 438/320 |
| 5,729,033 | A  |   | 3/1998  | Hafizi |
| 6,602,791 | B2 | * | 8/2003  | Ouellet et al. ................ 438/696 |
| 6,965,133 | B2 |   | 11/2005 | Geiss et al. |
| 7,119,416 | B1 |   | 10/2006 | Adam et al. |
| 7,265,018 | B2 |   | 9/2007  | Dunn et al. |
| 9,059,196 | B2 | * | 6/2015  | Benoit et al. |
| 9,093,491 | B2 | * | 7/2015  | Adkisson .......... H01L 29/66242 |
| 9,105,677 | B2 | * | 8/2015  | Dunn ................ H01L 29/737 |
| 9,111,986 | B2 | * | 8/2015  | Camillo-Castillo .... H01L 29/73 |
| 2005/0191911 | A1 | * | 9/2005 | Greenberg et al. ........... 439/762 |
| 2008/0121930 | A1 | * | 5/2008 | Adam et al. .................. 257/190 |

(Continued)

FOREIGN PATENT DOCUMENTS

EP 0476380 A1 3/1992
EP 0747964 B1 12/1999

*Primary Examiner* — Victoria K Hall
(74) *Attorney, Agent, or Firm* — Anthony J. Canale; Hoffman Warnick LLC

(57) ABSTRACT

The present disclosure relates to integrated circuit (IC) structures and methods of forming the same. An IC structure according to the present disclosure can include: a doped substrate region adjacent to an insulating region; a crystalline base structure including: an intrinsic base region located on and contacting the doped substrate region, the intrinsic base region having a first thickness; an extrinsic base region adjacent to the insulating region, wherein the extrinsic base region has a second thickness greater than the first thickness; a semiconductor layer located on the intrinsic base region of the crystalline base structure; and a doped semiconductor layer located on the semiconductor layer.

9 Claims, 10 Drawing Sheets

(56) References Cited

U.S. PATENT DOCUMENTS

| | | |
|---|---|---|
| 2012/0313146 A1 | 12/2012 | Cantell et al. |
| 2013/0140566 A1 | 6/2013 | Chan et al. |
| 2013/0147017 A1 | 6/2013 | Camillo-Castillo et al. |
| 2013/0207235 A1 | 8/2013 | Faucher et al. |
| 2015/0214344 A1* | 7/2015 | Benoit .............. H01L 29/66272 257/565 |
| 2015/0228769 A1* | 8/2015 | Leidy .................. H01L 29/7371 257/197 |
| 2015/0311283 A1* | 10/2015 | Adkisson .......... H01L 29/66242 257/586 |

* cited by examiner

BIPOLAR TRANSISTOR WITH EXTRINSIC BASE REGION AND METHODS OF FABRICATION

BACKGROUND

Embodiments of the invention relate generally to improving the structure of a bipolar transistor (also known as a bipolar junction transistor or "BJT") for high frequency applications (i.e., above approximately five hundred gigahertz (GHz)). More specifically, embodiments of the invention include the structure of a bipolar transistor and methods of forming the disclosed structure.

In integrated circuit (IC) structures, a transistor is a critical component for implementing proposed circuitry designs. In analog circuitry, numerous functions can be implemented with bipolar transistors. For example, the ability to control the flow of electric current between terminals of the transistor can allow the transistor to act as a switch, and therefore act as a building block for logic functions. Generally, a bipolar transistor includes three electrical terminals: a collector, a base, and an emitter. The flow of electricity between the collector and emitter terminals of a bipolar transistor can be controlled by adjusting the electric current or voltage difference between the base and emitter terminals.

In circuitry configured to operate at frequencies higher than approximately three hundred GHz, bipolar transistors may offer more reliable performance than other types of transistors, e.g., metal oxide semiconductor field effect transistors (MOSFETs). Bipolar transistors can be manufactured with equipment and techniques suitable for creating other microelectronic devices. The effectiveness of a bipolar transistor depends in part on parasitic losses (e.g., resistances and capacitances) within components of the transistor structure being used. As a result, the physical structure of a bipolar transistor can influence the reliability and performance of the transistor when it is implemented in a product or larger system.

SUMMARY

A first aspect of the present disclosure provides an integrated Circuit (IC) structure. The IC structure can include: a doped substrate region adjacent to an insulating region; a crystalline base structure including: an intrinsic base region located on and contacting the doped substrate region, the intrinsic base region having a first thickness; an extrinsic base region adjacent to the insulating region, wherein the extrinsic base region has a second thickness greater than the first thickness; a semiconductor layer located on the intrinsic base region of the crystalline base structure; and a doped semiconductor layer located on the semiconductor layer.

A second aspect of the present disclosure provides a method of forming an integrated circuit (IC) structure including: forming a precursor structure on a substrate, wherein the precursor structure includes: a crystalline base layer, a first semiconductor layer positioned on the crystalline base layer, and a second semiconductor layer positioned on the first semiconductor layer; removing the substrate and the precursor structure to expose a portion of the substrate beneath the precursor structure; selectively removing the first semiconductor layer, the second semiconductor layer, and the exposed portion of the substrate to undercut an exposed extrinsic base region of the crystalline base layer; and growing the extrinsic base region to have a greater thickness than an intrinsic base region of the crystalline base structure positioned between the substrate and the first semiconductor layer.

A third aspect of the present disclosure provides a method of forming an integrated circuit (IC) structure. The method can include: forming a precursor structure on a substrate, wherein the precursor structure includes: a crystalline base layer, a first semiconductor layer positioned on the crystalline base layer, and a second semiconductor layer positioned on the first semiconductor layer; removing the substrate and the precursor structure to expose two portions of the substrate beneath the precursor structure; selectively removing the first semiconductor layer, the second semiconductor layer, and the exposed two portions of the substrate to undercut two exposed extrinsic base regions of the crystalline base layer; and growing the two extrinsic base regions to have a greater thickness than an intrinsic base region of the crystalline base structure positioned between the substrate and the first semiconductor layer and between the two extrinsic base regions.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure relate to an integrated circuit (IC) structure which can be implemented as a bipolar transistor, in addition to methods of forming the disclosed structure. Embodiments of the present disclosure can include forming a precursor structure on a substrate, the precursor structure including: a crystalline base layer, a first semiconductor layer positioned on the crystalline base layer, and a second semiconductor layer positioned on the first semiconductor layer. Further processes according to the present disclosure include removing the substrate and the precursor structure to expose a portion of the substrate beneath the precursor structure, selectively removing the first semiconductor layer, the second semiconductor layer, and the exposed portion of the substrate to undercut an exposed extrinsic base region of the crystalline base layer, and growing the extrinsic base region to have a greater thickness than an intrinsic base region of the crystalline base structure positioned between the substrate and the first semiconductor layer.

Embodiments of the IC structure disclosed herein offer a reduced base resistance and a reduced collector-base capacitance as compared to conventional bipolar transistor structures. An IC structure with these features can include a doped substrate region adjacent to an insulating region, and a crystalline base structure formed at least partially on the doped substrate region. The crystalline base structure can include: an intrinsic base region located on and contacting the doped substrate region, and an extrinsic base region adjacent to the insulating region. The thickness of the extrinsic base region can be greater than the thickness of the intrinsic base region. The IC structure can also include a semiconductor layer located on the intrinsic base region of the crystalline base structure; and a doped semiconductor layer located on the semiconductor layer.

Figure 1:
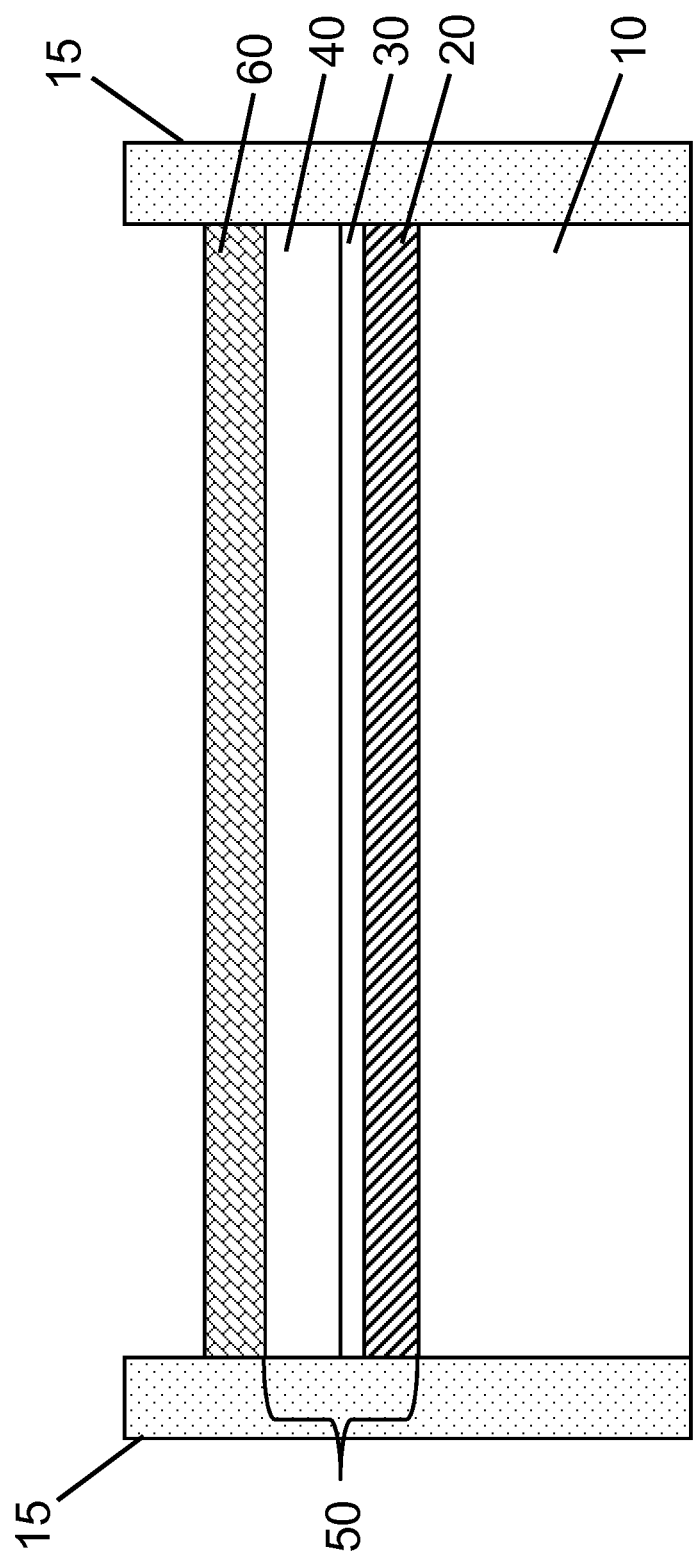
FIGS. 1-6 depict processes for forming an integrated circuit (IC) structure according to embodiments of the present disclosure.

Turning to FIG. 1, a process according to aspects of the present disclosure is shown. Methods of the present disclosure can include forming several components in layers on a substrate 10. Substrate 10 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 10 or a portion thereof may be strained.

After forming substrate 10, embodiments of the present disclosure can include forming trench isolations 15 to separate materials formed and processed according to the present disclosure from other components or IC structures. A trench isolation refers to an electrically insulating barrier formed in regions of substrate 10 where semiconductor material has been removed to form a trench structure. Trench isolation 15 can be formed by etching or otherwise creating a narrow trench within substrate 10, and filling the etched trench with an oxide or other electrically insulative material. In a particular embodiment, trench isolation 15 can be a combination of multiple electrically insulative materials formed by independent processes. For example, trench isolation 15 may include a deep trench isolation formed up to the surface of substrate 10 by a combination of etching, deposition, chemical mechanical polishing (CMP) or an equivalent combination of processes, with the remainder of trench isolation 15 being formed as a shallow trench isolation (STI) during a different process step. Though trench isolation 15 can be formed at the beginning of a process for fabricating an IC structure according to the present disclosure, it is understood that trench isolation 15 can alternatively be formed during or after other process steps discussed herein.

Some of the materials used to form an IC structure in embodiments of the present disclosure can be formed on substrate 10, and may additionally be positioned between trench isolations 15. Processes discussed herein can include forming a crystalline base layer 20 on substrate 10. Crystalline base layer 20 may be composed of a crystalline conductive or semiconductive material including, e.g., monocrystalline silicon germanium (SiGe). A "monocrystalline" substance can include, for example, a solid crystalline material exhibiting a crystal lattice that is continuous and unbroken, thereby having no grain boundaries at its edges. When formed on substrate 10, crystalline base layer 20 can have a thickness of, for example, between approximately ten nanometers (nm) and approximately one-hundred and twenty nm. Crystalline base layer 20 can be formed by any currently known or later developed process for forming a crystalline material on a substrate, which as examples may include deposition or epitaxial growth. Epitaxial growth or "epitaxy" can refer to a process in which a thin layer of single-crystal material is deposited on a single-crystal substrate. Epitaxial growth can occur in such a way that the crystallographic structure of the substrate is reproduced in the formed material. Alternative techniques can include depositing crystalline base layer 20 on bulk substrate 10. As used herein, the term "depositing" may include any now known or later developed technique appropriate for deposition, including but not limited to, for example: chemical vapor deposition (CVD), low-pressure CVD (LPCVD), plasma-enhanced CVD (PECVD), sub-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

In addition, a first semiconductor layer 30 can be formed upon crystalline base layer 20. First semiconductor layer 30 can have a smaller thickness than crystalline base layer 20. Specifically, first semiconductor layer 30 may have a thickness between, e.g., approximately two nm and approximately thirty nm. First semiconductor layer 30 can be composed of substantially the same material as substrate 10, and may be composed of an undoped layer of pure silicon (also known in the art as i-silicon or "i-Si"). Alternatively, first semiconductor layer 30 can be composed of a different semiconductor material from substrate 10. Processes of the present disclosure can also include forming a second semiconductor layer 40 upon first semiconductor layer 30. Second semiconductor layer 40 can have a thickness between, for example, approximately twenty-five nm and approximately three hundred nm, and may be doped n-type during or after the processes discussed herein. Doping is the process of introducing impurities (dopants) into a semiconductor material, or elements formed on the semiconductor material, and is often performed with a mask (or previously-formed, elements in place) so that only certain areas of the substrate will be doped. For example, doping is used to form the source and drain regions of a transistor. An ion implanter is typically employed for the actual implantation. An inert carrier gas such as nitrogen, or hydrogen, or helium is usually used to bring in the impurity source (dopant). N-type dopants may include but are not limited to: phosphorous (P), arsenic (As), antimony (Sb). An n-type dopant is an element introduced to semiconductor to generate free electron (by "donating" electron to semiconductor). The n-type dopant must have one more valance electron than the semiconductor. Common donors in silicon (Si) can include: phosphorous (P), arsenic (As), antimony (Sb) and in gallium arsenic (GaAs): sulphur (S), selenium (Se), tin (Sn), silicon (Si), and carbon (C). P-type dopants may include but are not limited to: boron (B), indium (In) and gallium (Ga). A p-type dopant is an element introduced to the semiconductor to generate free hole (by "accepting" electron from semiconductor atom and "releasing" hole at the same time). An acceptor atom must have one valence electron less than the host semiconductor. Boron (B) is the most common acceptor in silicon technology, but alternatives include indium and gallium (gallium features high diffusivity in $SiO_2$, and hence, oxide cannot be used as mask during Ga diffusion).

In embodiments of the present disclosure, first semiconductor layer 30 may be initially undoped and second semiconductor layer 40 may be heavily doped. To provide electrical conductivity between first and second semiconductor layers 30, 40, first and semiconductor layers 30, 40 can be subject to thermal annealing before, during, or after processes of the present disclosure are performed. In an example embodiment, second semiconductor layer 40 can be doped with N-type dopants such as arsenic and/or phosphorous. The first and second semiconductor layers 30, 40 can then be annealed to cause dopants from second semiconductor layer 40 to diffuse into first semiconductor layer 30. Thus, first semiconductor layer 30 may become doped with a lower concentration of dopants than first semiconductor layer 30.

Crystalline base layer 20, first semiconductor layer 30, and second semiconductor layer 40 together may form a precursor structure 50 positioned on substrate 10. Substrate 10 and precursor structure 50 can be machined, processed, modified, etc. according to processes discussed herein to form an IC structure according to embodiments of the present disclosure. Processes of the present disclosure can also, optionally, include forming a sacrificial cap 60 on precursor structure 50. Sacrificial cap 60 can be composed of an electrically insulative substance, such as a nitride material (i.e., a substance which at least partially includes a nitrogen ion, such as silicon nitride ($Si_3N_4$), titanium nitride (TiN), gallium nitride (GaN), and/or a nitrided oxide material). As discussed elsewhere herein, sacrificial cap 60 can shield some components of precursor structure 50 and/or substrate 10 from selective processing or removal steps which would otherwise remove the shielded layers or structures. Processes according to the present disclosure are described with sacrificial cap 60 being in place.

Figure 2:
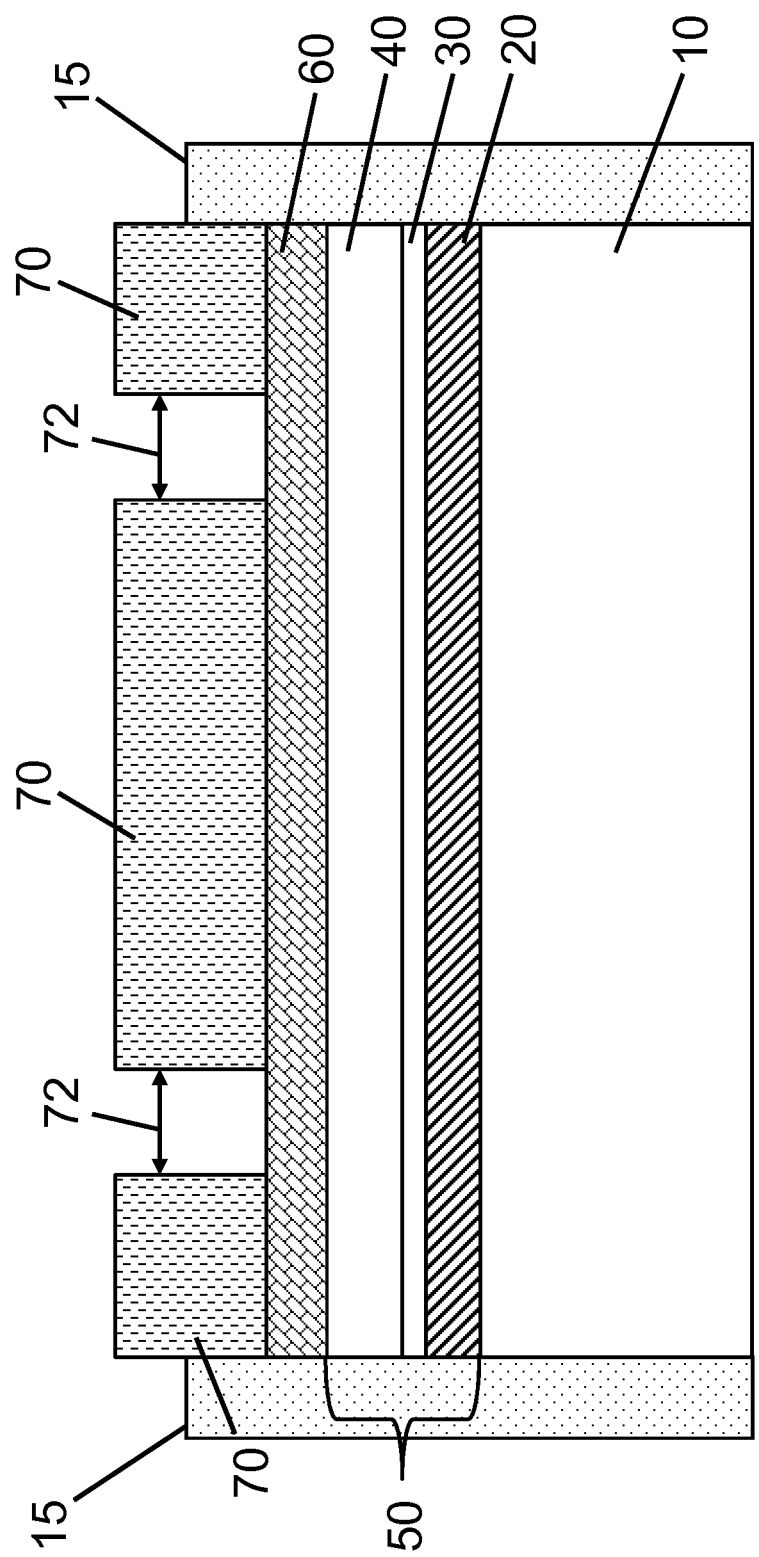

Referring now to FIG. 2, a trench mask 70 can be placed on sacrificial cap 60 and/or precursor structure 50 to allow the etching of at least one area of the formed structure. To form an IC structure according to embodiments of the present disclosure, trench mask 70 can include one or more openings 72 which expose a surface of precursor structure 50 or sacrificial cap 60. Portions of substrate 10, precursor structure 50, sacrificial cap 60, and/or other materials discussed herein can be removed according to any currently known or later developed process for removing materials from an IC structure, such as etching. "Etching" generally refers to the removal of material from a substrate (or structures formed on the substrate), and is often performed with a mask (e.g., trench mask 70) in place so that material may selectively be removed from a structure, while leaving the remaining material unaffected. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. The ability to selectively etch particular materials is fundamental to many semiconductor fabrication processes. A wet etch will generally etch a homogeneous material (e.g., oxide) isotropically, but a wet etch may also etch monocrystalline materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trench isolation (STI) trenches. Portions of substrate 10, precursor structure 50 and/or sacrificial cap 60 can be removed by application of ordinary plasma etching. In addition or alternatively, one or more other etching processes described herein, or any other etching process currently known or later developed, can be used or adapted to remove portions of substrate 10, precursor structure 50 and/or sacrificial cap 60.

Figure 3:
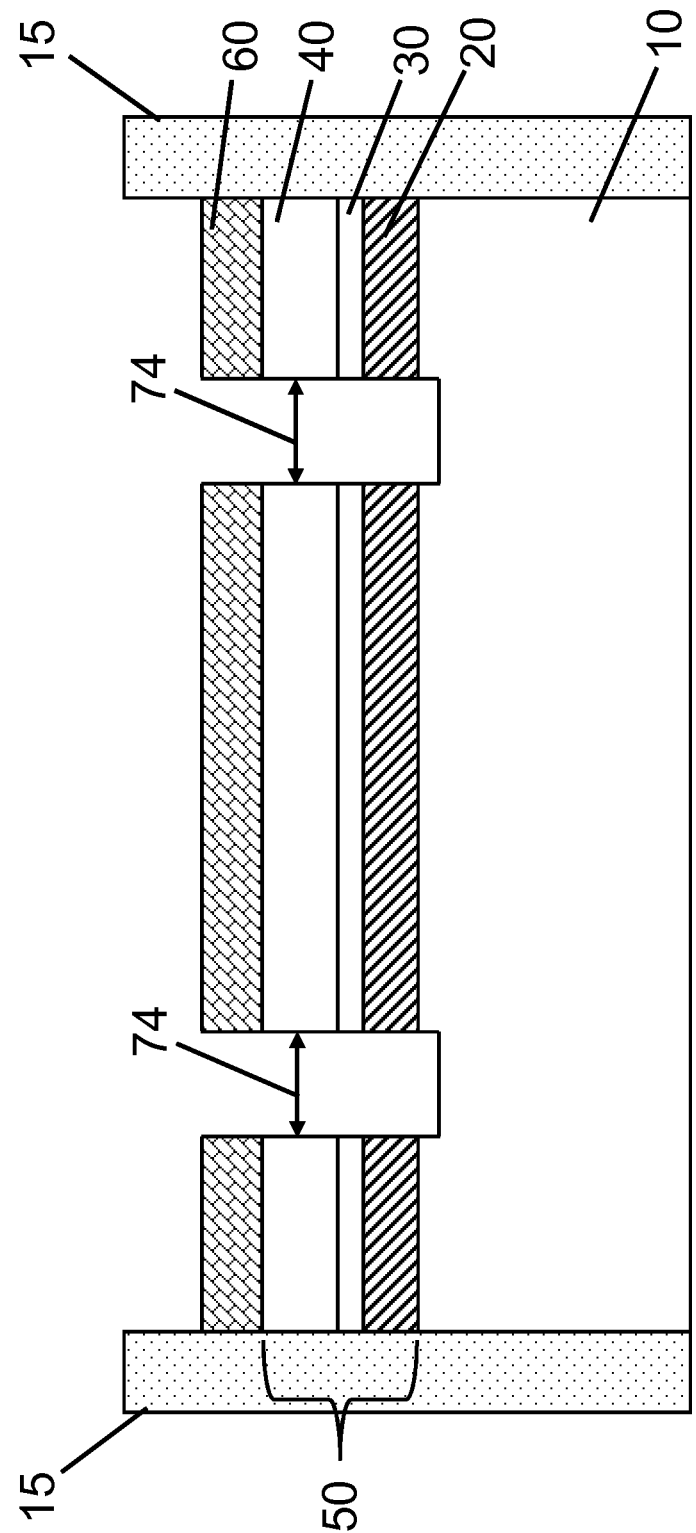

Turning to FIG. 3, trench mask 70 can be removed after portions of sacrificial cap 60, precursor structure 50, and/or substrate 10 below opening 72 are removed. The removing of portions of substrate 10, precursor structure 50, and/or sacrificial cap 60 can result in an opening 74 exposing a portion of substrate 10 beneath precursor structure 50. Although some variations and/or combinations of removal techniques, such as etching, may occur in processes of the present disclosure, at least one portion of substrate 10 can be exposed after the etching step is complete. Exposing a portion of substrate 10 can allow selective etching processes to remove portions of substrate 10 and/or other materials in other process steps discussed herein.

Figure 4:
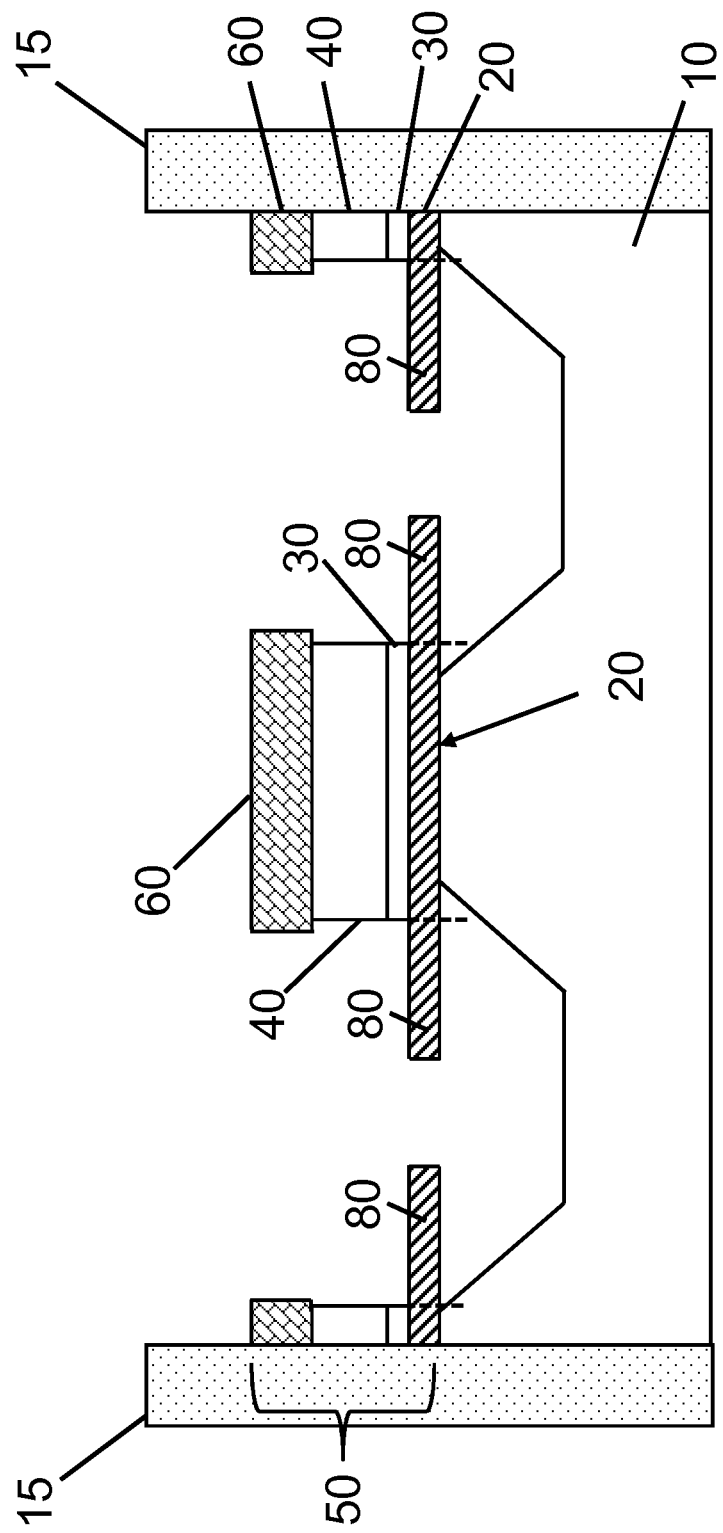

Turning to FIG. 4, processes of the present disclosure can include removing (e.g., by selective etch) portions of substrate 10, first semiconductor layer 30, and second semiconductor layer 40 and to undercut an exposed extrinsic base region 80 of crystalline base layer 20. Selective etching can refer to, e.g., an etching process in which one or more materials are etched more rapidly than other materials, which may be etched very slowly or not etched at all. In an illustrative example, the selective etching of substrate 10, first semiconductor layer 30, and second semiconductor layer 40 can be carried out by way of a wet etch which leaves crystalline base layer 20 (composed of, e.g., monocrystalline SiGe), and optionally sacrificial cap 60, largely intact. This process can also undercut crystalline base layer 20 to form an exposed extrinsic base region 80 protruding from the remaining materials of precursor structure 50. Exposed extrinsic base region 80 of crystalline base layer 20 can be grown or otherwise enlarged as described herein to increase its width while the remainder of crystalline base layer 20 retains its original width. The selective etching of substrate 10, first semiconductor layer 30, and second semiconductor layer 40 can optionally be followed by a selective etch of sacrificial cap 60, e.g., by application of a hot phosphoric acid etch, to remove any overhanging regions of sacrificial cap 60 from precursor structure 50.

Figure 5:
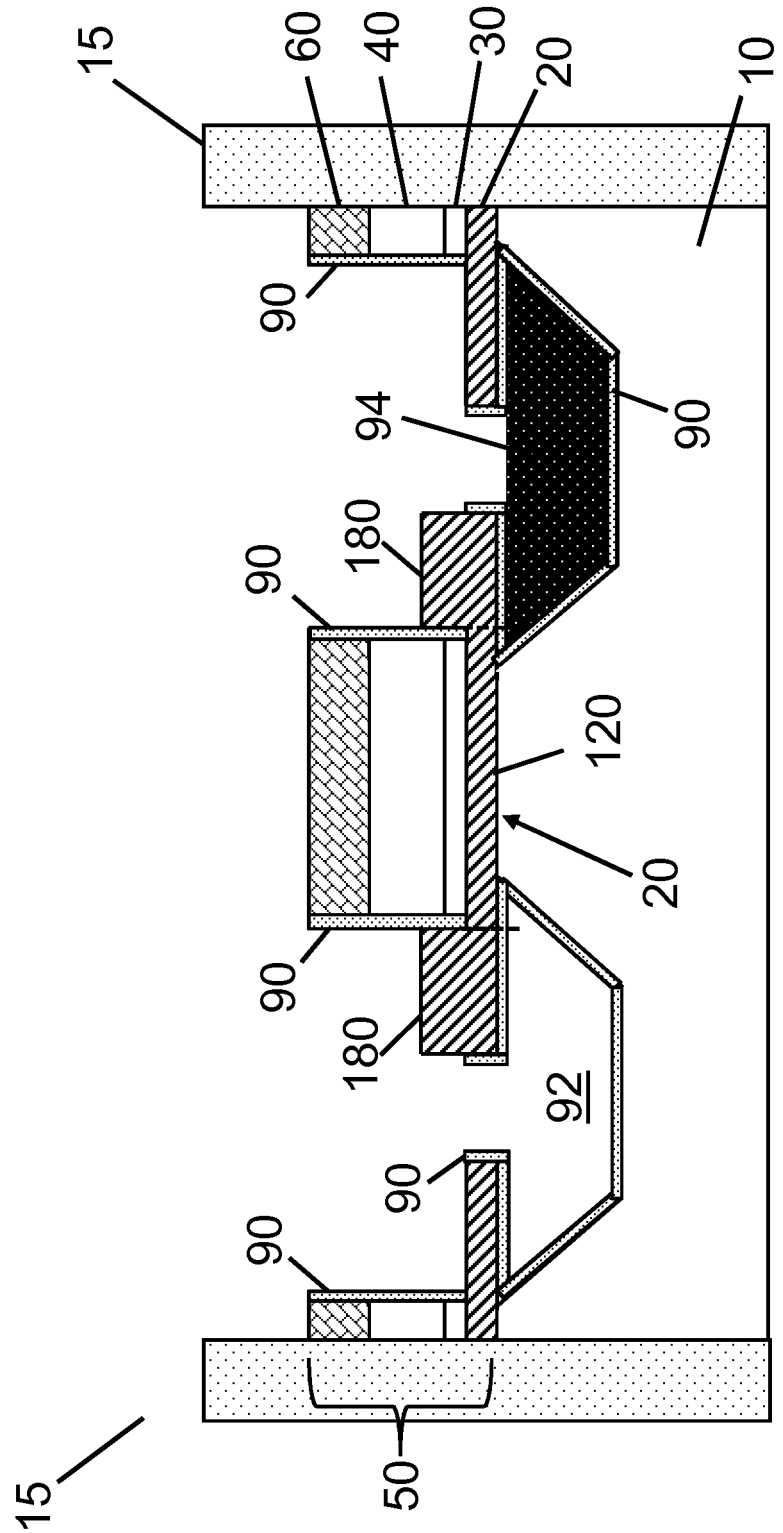

Turning to FIG. 5, the present disclosure can include forming a dielectric film 90 on substrate 10 and precursor structure 50, after the forming and removing processes discussed herein. A "dielectric" substance refers to any electrically insulative substance, whether currently known or later developed, used in an integrated circuit structure. In an embodiment, dielectric film 90 can be composed of silicon nitride ($Si_3N_4$). Alternative dielectric materials used in dielectric film 90 can include, e.g., silicon dioxide ($SiO_2$), fluorinated $SiO_2$ (FSG), hydrogenated silicon oxycarbide (SiCOH), porous SiCOH, boro-phospho-silicate glass (BPSG), silsesquioxanes, near frictionless carbon (NFC), carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Dielectric film 90 can be formed on portions of substrate 10 and/or precursor structure 50 by deposition alone, deposition combined with an etch-back procedure, or any other currently known or later developed process for forming a film of electrically insulating material on a substrate. As a specific example, forming dielectric film 90 can include forming a low-temperature oxide on both substrate 10 and the remaining portions of precursor structure 50, and then etching dielectric film 90 from the top of the protruding regions of crystalline base layer 20. Removing dielectric film 90 from the top of the protruding regions of crystalline base layer 20 allows an extrinsic region of crystalline base layer 20 be enlarged, e.g., by epitaxial growth, as discussed elsewhere herein. The forming of dielectric film 90 may passivate (i.e., render nonconductive) the exposed surfaces of substrate 10 and precursor structure 50 to electrically separate the components of the resulting IC structure from other IC structures.

The processes discussed herein can form an isolation trench 92 which partially undercuts precursor structure 50. If desired, and as shown on the right side of FIG. 5, isolation trench 92 can be filled with an oxide 94 to protect dielectric film 90 within isolation trench 92 during other fabrication processes and steps. Oxide 94 can be formed, e.g., by depositing a flowable oxide onto substrate 10, curing the flowable oxide into a solid state, and then performing a selective oxide etch to remove portions of oxide 94 located outside of isolation trench 92. Oxide 94 within isolation trench 92 can be removed after its shielding of substrate 10 and/or dielectric film 90 from other processes discussed herein is no longer desired.

Crystalline base layer 20 can include an intrinsic base region 120 and an extrinsic base region 180. The greater thickness of extrinsic base region 180 relative to intrinsic base region 120 can provide technical advantages, such as a reduced resistance of the resulting IC structure. Furthermore, substrate 10 contacting crystalline base layer 20 at intrinsic base region 120 but not extrinsic base region 180 can reduce the resulting structure's parasitic capacitance. This structure can be formed by growing an exposed area of crystalline base layer 20 positioned above isolation trench 92 (which may include oxide 94 therein). The exposed area be enlarged, e.g., by depositing or growing materials according to any currently known or later developed process. In particular, monocrystalline SiGe can be selectively epitaxially grown on the exposed area of crystalline base layer 20 to form extrinsic base region 180. Where other portions of crystalline base layer 20 are exposed, epitaxial growing may cause these other portions of crystalline base layer 20 to increase in thickness. The exposed portions of crystalline base layer 20 outside of extrinsic base region 180 maintain substantially their original thickness from the simultaneous or alternative deposition/etch characteristics of selective epitaxy. Specifically, the selective epitaxial growth on substrate 10 can occur at a faster rate because any growth on dielectric surfaces is slower and thus prohibited by the simultaneous or alternative etch processes. The resulting extrinsic base region 180 can have a greater thickness than intrinsic base region 120 positioned between substrate 10 and first semiconductor layer 30. The greater thickness of extrinsic base region 180 as compared to intrinsic base region 120 reduces the electrical resistance across crystalline base region 20 between substrate 10 or first and second semiconductor layers 30, 40, and any electrical contacts formed on extrinsic base region 180.

Figure 6:
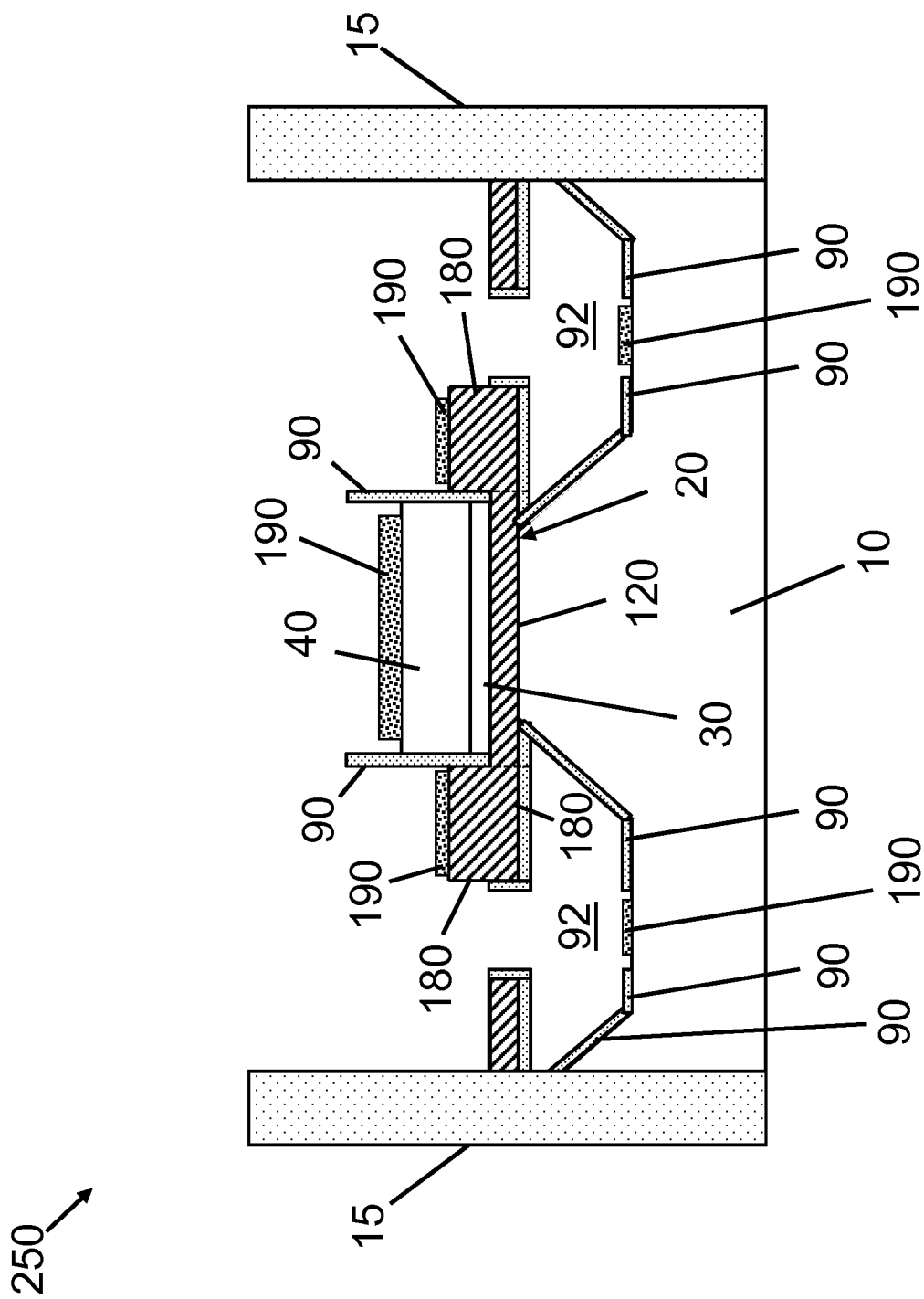

Turning to FIG. 6, processes of the present disclosure can include removing sacrificial cap 60 and forming silicide contacts 190 on substrate 10, second semiconductor layer 40, and extrinsic base region 180. Sacrificial cap 60 and accompanying portions of dielectric film 90 can be removed, e.g., by application of a hot phosphoric acid etch. Silicide contacts 190 may be formed using any now known or later developed technique, e.g., performing an in-situ pre-clean, depositing a metal such as titanium, nickel, cobalt, etc., annealing to have the metal react with silicon, and removing any unreacted metal. If desired, silicide contacts can be formed as a result of a self-aligned silicide ("silicide") process. A salicide process refers to a process in which silicide contacts 190 are formed only in areas where deposited metal is in direct contact with silicon. Before forming silicide contacts 190 on substrate 10, portions of dielectric film 90 may be removed from substrate 10 by applying a chemical process, such as a hot phosphoric acid etch or another currently known or later developed etching process. A portion of dielectric film 90 can remain on substrate 10 where silicide contacts 190 are not formed. The remaining dielectric film 90 on substrate 10 alongside silicide contacts 190 can passivate the surfaces of substrate 10 on which silicide contacts 190 are not present. As an alternative to forming silicide contacts 190 on extrinsic base region 180, embodiments of the present disclosure can optionally use a mask (not shown) to remove an edge portion of extrinsic base region 180 and form a sub-collector (not shown) thereon to create a collector contact outside the edge of extrinsic base region 180.

Figure 7:
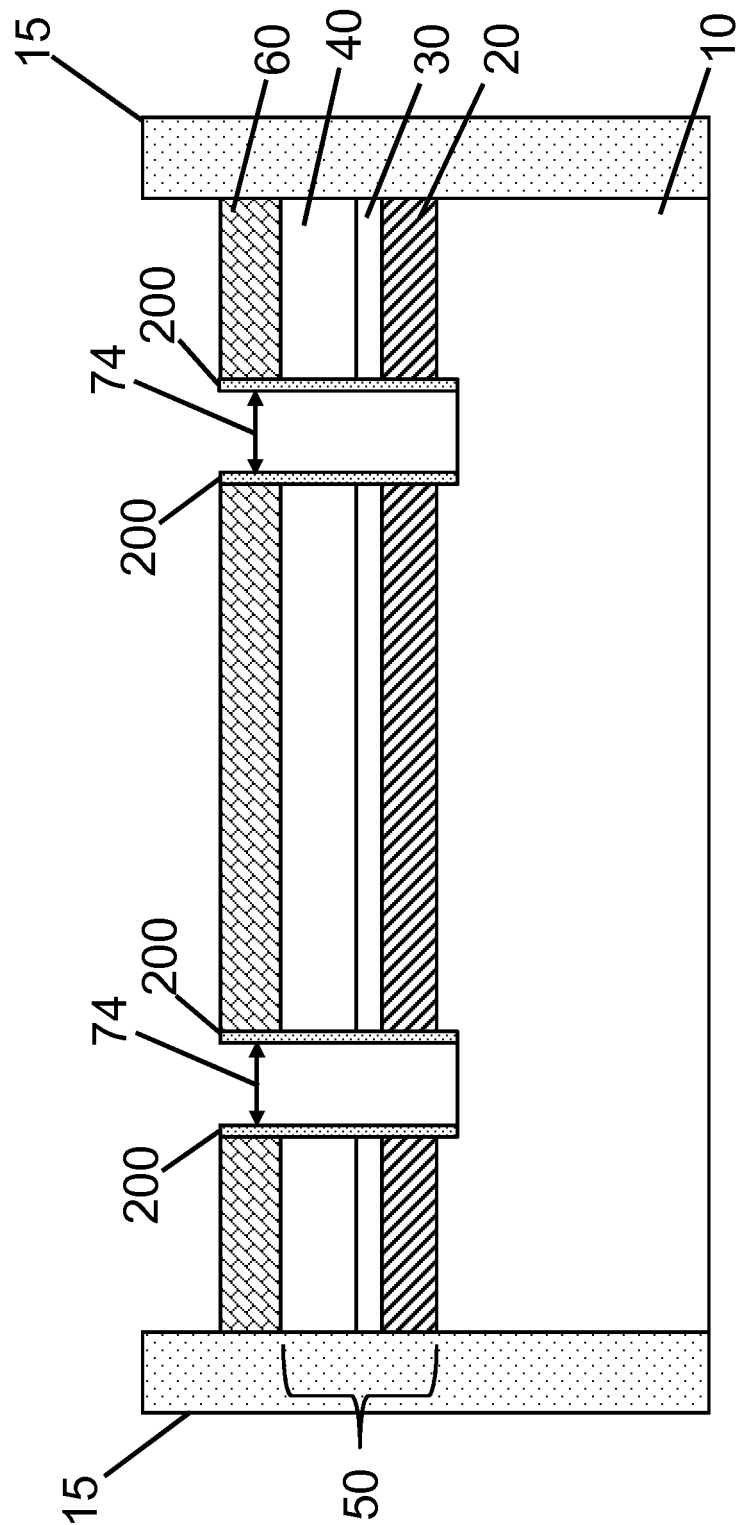
FIGS. 7-9 depict alternative processes for forming an IC structure according to embodiments of the present disclosure.

Turning to FIG. 7, alternative processes of forming extrinsic base regions 180 (FIG. 6) according to the present disclosure are shown. In an alternative process, dielectric spacers 200 can be formed within openings 74 of precursor structure 50 before substrate 10 and precursor structure 50 are etched to undercut crystalline base layer 20. Dielectric spacers 200 can be composed of, e.g., an oxide compound (including the insulative oxide compounds discussed herein) which may be formed by deposition. Dielectric spacers 200 can also be in the form of a composite spacer formed by, e.g., depositing a nitride film upon a thin oxide layer, and then carrying out an end-pointed etch to etch the nitride over flat regions, forming a composite nitride/oxide spacer on the sidewalls of precursor structure 50. An end-pointed etch can use optical signals of an N-species material in the etch chamber, such that when nitride film is etched from particular areas (e.g., flat regions), the underlying oxide is exposed, and the intensity of N-containing species is reduced, thereby signaling that the etching can be stopped.

Dielectric spacers 200 can passivate (i.e., render electrically nonconductive) the sidewalls of precursor structure 50 within openings 74 to protect precursor structure 50 from etchants used to remove portions of substrate 10. After dielectric spacers 200 are formed, substrate 10 can be etched (e.g., with an etching material selective to p-type doped silicon and/or SiGe) to undercut crystalline base layer 20 and form an isolation trench 92 (FIGS. 5, 6) within substrate 10. At any point after isolation trench 92 (FIGS. 5, 6) is formed, dielectric spacers 200 can be removed.

Figure 8:
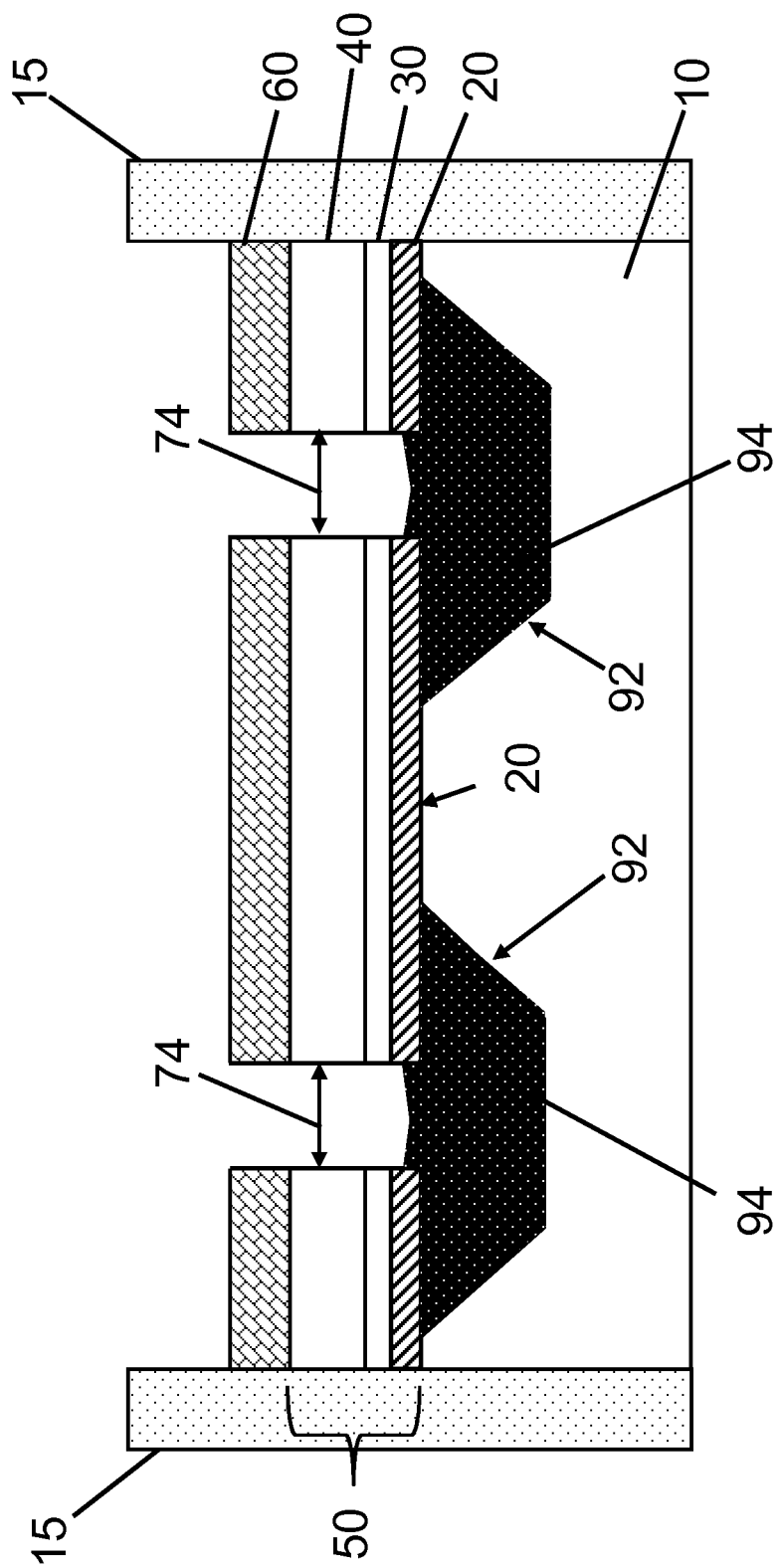

Turning now to FIG. 8, isolation trench 92 can be filled with oxide 94 before other portions of first and second semiconductor layers 30, 40, are removed. Oxide 94 can be provided in the form of a flowable oxide material deposited into isolation trench 92 (FIGS. 5, 6). Filling the undercut portions of substrate 10 with oxide 94 can provide mechanical support to crystalline base layer 20 and/or prevent portions of substrate 10 from being removed at the same time as portions of precursor structure 50. To remove portions of oxide 94 covering first and/or second semiconductor layers 30, 40, oxide 94 can be exposed to a solution of hydrogen fluoride in a controlled oxide etch. Exposing the sidewalls of first and second semiconductor layers 30, 40 in openings 74 can allow portions of precursor structure 50 to be removed according to other processes discussed herein.

Figure 9:
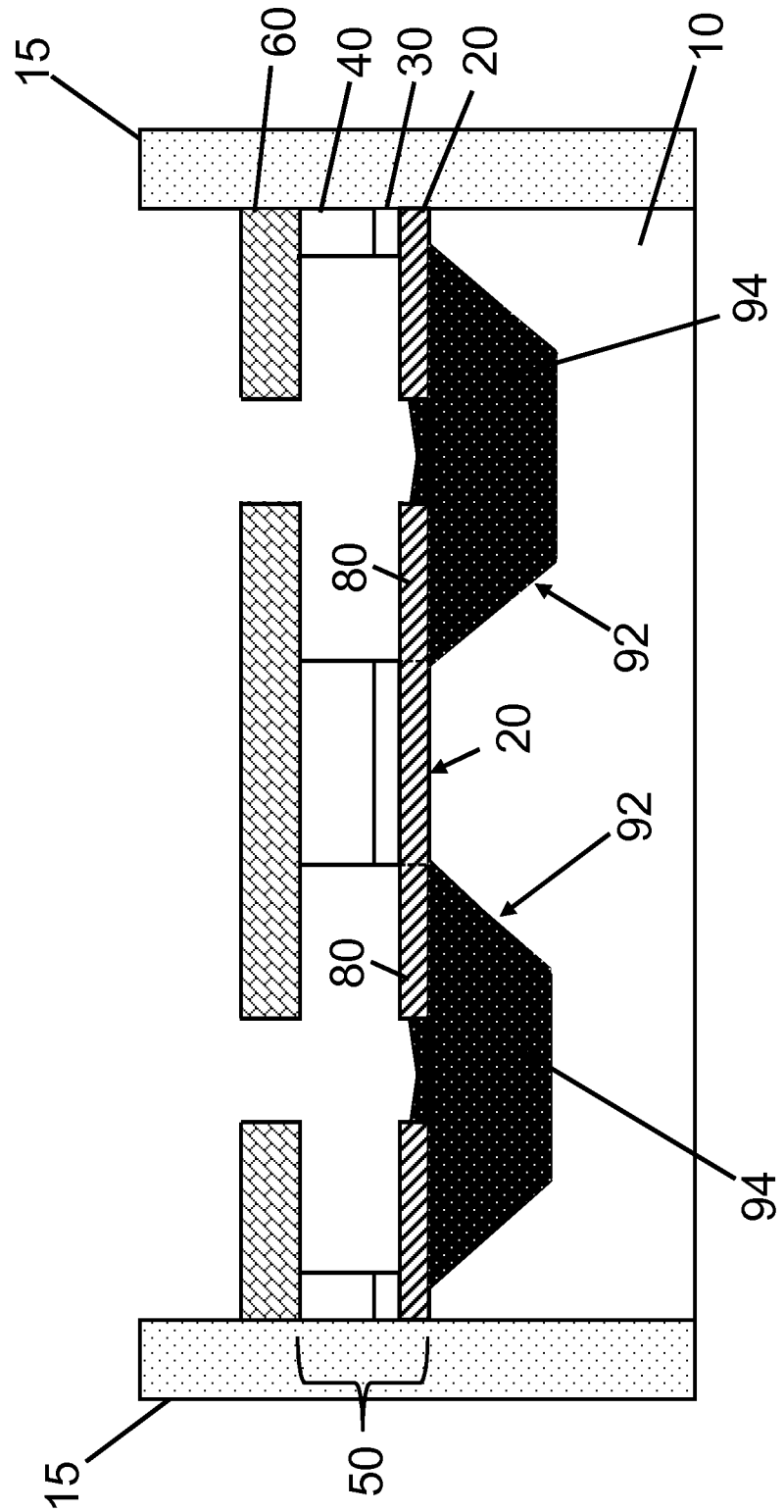

Turning to FIG. 9, first and second semiconductor layers 30, 40, can be subjected to a selective lateral undercut etch after the undercut portions of substrate 10 are filled with oxide 94. The selective lateral undercut etch can create exposed extrinsic base regions 80 of crystalline base layer 20. This selective etch process can also undercut sacrificial cap 60 in the event that sacrificial cap 60 was not previously removed. Oxide 94 can shield substrate 10 from being etched. The selective etching can retain a portion of first and second semiconductor layers 30, 40 for use as an emitter or collector of a bipolar transistor. At this point, dielectric spacers can be formed according to the processes described previously, and crystalline base layer 20 can be grown to form extrinsic base region 180 (FIG. 5). After the formation of extrinsic base by selective epitaxy, oxide 94 can be removed from isolation trench 92 (e.g., from exposure to a solution of hydrogen fluoride in a controlled oxide etch), and the remaining components discussed herein can be formed as described herein.

Figure 10:
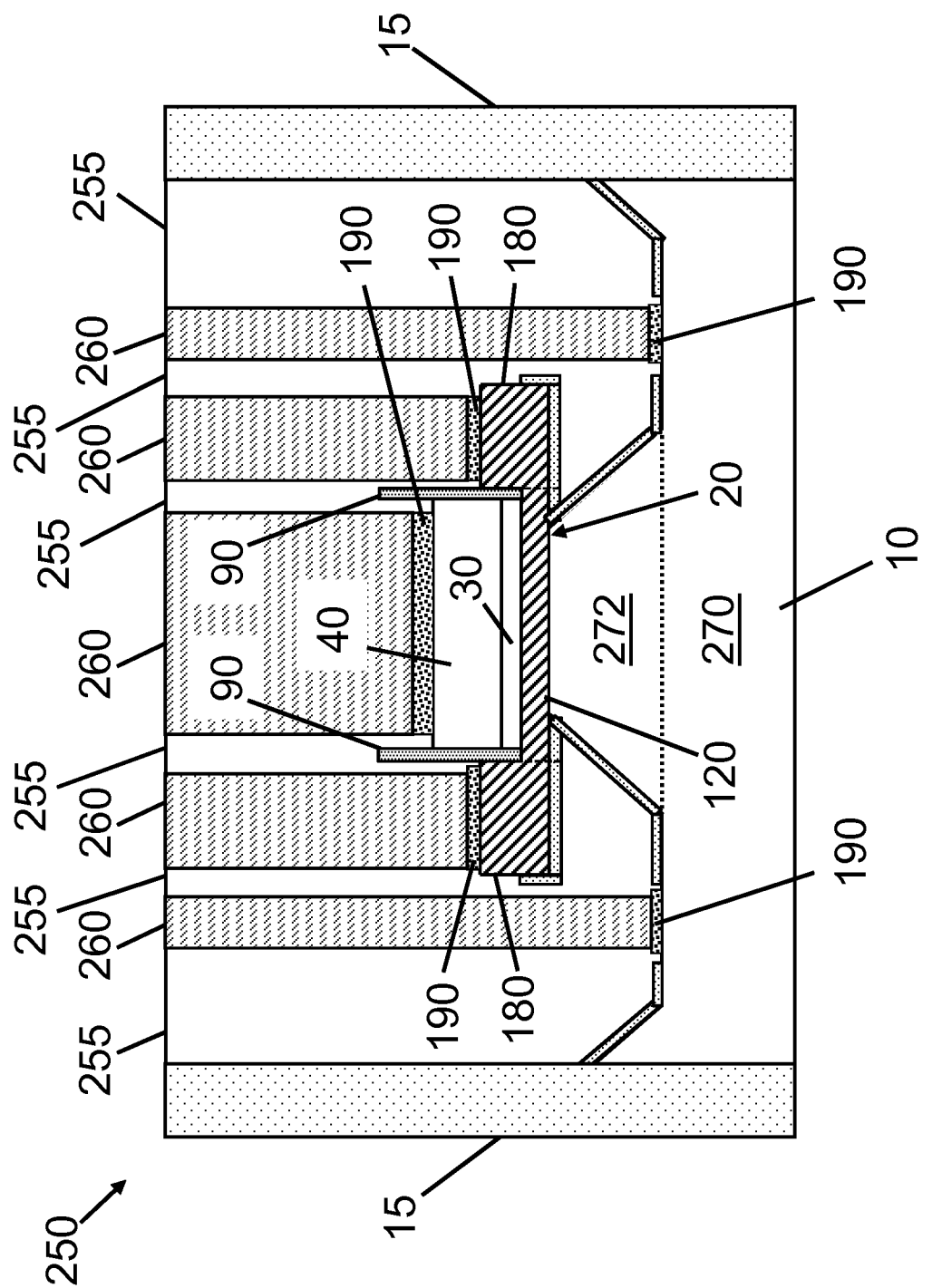
FIG. 10 is a cross-sectional view of an IC structure according to embodiments of the present disclosure.

Turning to FIG. 10, embodiments of the present disclosure provide an IC structure 250. IC structure 250 can be formed as a result of the processes described herein and shown in FIGS. 1-6, optionally including the optional steps further described herein and shown in FIGS. 7-9. In an embodiment, further process steps described herein can convert the structure shown in FIG. 6 into IC structure 250 shown in FIG. 10. IC structure 250 can be used as a bipolar transistor, with substrate 10 being a collector or emitter, crystalline base layer 20 (including intrinsic base region 120 and extrinsic base region 180) being a base, and second semiconductor layer 40 being a collector or emitter set off from and electrically coupled to the base through first semiconductor layer 30. At any point during the processes of forming IC structure 250 discussed herein, substrate 10 can be doped either p-type or n-type to form an electrically conductive substance capable of acting as a collector or emitter, with second semiconductor layer 40 being doped p-type or n-type to act as a the complementary emitter or collector. In addition, the remaining portions of precursor structure 50 and/or sacrificial cap 60 adjoining trench isolations 15 can optionally be removed by of the removal techniques discussed herein, whether applied alone or in combination with other techniques.

IC structure 250 can include substrate 10 positioned alongside or otherwise adjacent to an insulating region (i.e., isolation trench 92 (FIGS. 5, 6, 8, 9). The openings between the various components of IC structure 250 can be filled with a dielectric material 255 such as one of the example dielectric materials discussed herein (e.g., a solid electrolyte or other substance such as a flowable oxide), or may be filled with a gas dielectric material (i.e., a partially or completely gaseous substance with electrically insulative properties, such as air) to further electrically insulate separated components of IC structure 250 from each other. Substrate 10 can be composed of a doped semiconductive material such as p-silicon to form a doped substrate region. Substrate 10 can make up a portion or the entirety of an emitter or collector region of a bipolar transistor. Crystalline base region 20 composed of a conductive or semiconductive crystalline material such as monocrystalline SiGe can be at least partially located on and contacting substrate 10. Crystalline base region 20 can function as a crystalline base structure composed of intrinsic base region 120 and extrinsic base region 180. Intrinsic base region 120 can be located on and be in contact with substrate 10, and may have a thickness of, e.g., between approximately ten nm and approximately thirty nm. Extrinsic base region 180 can be located alongside or otherwise adjacent to intrinsic base region 180, and may be composed of the same material as intrinsic base region 120. Extrinsic base region 180 can have a thickness greater than the thickness of intrinsic base region 120. The thickness of extrinsic base region 180 can be between approximately twenty-five nm and approximately three hundred nm, so long as the thickness of extrinsic base region 180 exceeds the thickness of intrinsic base region 120.

Contacts 260, which may be composed of any currently known or later developed conductive material (e.g., tungsten, copper, aluminum, silver, etc.) can couple silicide contacts 190 to external components and/or IC structures, including metal level wire layers (not shown). To form contacts 260, portions of dielectric material above silicide contacts 190, can be removed by removal processes, such as etching, to form openings. Contacts 260 can be formed as metal deposited into the openings removed from dielectric material 255.

IC structure 250 can also include components which together make up the emitter or collector region of a bipolar transistor. More specifically, first and second semiconductor layers 30, 40, can make up the structure of the complementary emitter or collector to the collector or emitter of substrate 10. First semiconductor layer 30 can be composed of a doped semiconductive material (e.g., produced by thermal annealing) or an undoped semiconductive material, such as i-silicon, and may be located on intrinsic base region 120 of crystalline base layer 20. Second semiconductor layer 40 can be composed of a semiconductive material doped the same as substrate 10 and may be located on first semiconductor layer 30, thereby forming a doped semiconductor layer. First semiconductor layer 30 and second semiconductor layer 40 can be composed of the same semiconductive material or can be composed of different semiconductive materials. The position of first semiconductor layer 30 between crystalline base region and second semiconductor layer 40 forms a heterojunction (e.g., an electrical interface between two different semiconductors with different bandgaps) between crystalline base layer 20 and first and second semiconductor layers 30, 40, in addition to between substrate 10 and crystalline base layer 20. First semiconductor layer 30 can haves a thickness of between approximately two nm and approximately thirty nm. As discussed elsewhere herein, IC structure 250 can also include dielectric film 90 on portions of substrate 10, crystalline base layer 20, and first and second semiconductor layers 30, 40. Dielectric film 90 can electrically insulate first and second semiconductor layers 30, 40 from extrinsic base region 180 of crystalline base layer 20, and can electrically insulate other components of IC structure 250 from each other.

IC structure 250 can include several of the elements discussed herein on opposing sides of the resulting structure. Specifically, a pair of insulating regions filled with dielectric material 255 can be adjacent to two locations of substrate 10, and crystalline base layer 20 can include a pair of extrinsic base regions 180 located at two locations adjacent to one of the two regions of dielectric material 255. In a particular embodiment, the two locations can be opposing ends of crystalline base layer within a two dimensional plane, as shown in FIG. 10. Each of the pair of extrinsic base regions 180 can have a greater thickness than the thickness of intrinsic base region 120. Including two regions of dielectric material 255 and two extrinsic base regions 180 in IC structure 250 can allow multiple silicide contacts 190 to be formed on each of substrate 10 and crystalline base layer 20.

In a particular embodiment, IC structure 250 can include silicide contacts 190 formed on and in contact with substrate 10. To improve electrical conductivity through substrate 10 of IC structure 250, substrate 10 may have varying concentrations of dopants therein. Specifically, substrate 10 can include a sub-collector region 270 located adjacent to and/or beneath silicide contacts 190 and a collector region 272 located adjacent to crystalline base layer 20. Sub-collector region 270 may have a higher concentration of dopant materials (e.g., arsenic or boron) than collector region 272 to preserve a heterojunction (i.e., a particular bandgap difference) between substrate 10 and crystalline base layer 20 while reducing the electrical resistance between silicide contacts 190 and substrate 10. To form sub-collector region 270 and collector region 272, collector region 272 can be implanted with a high concentration of dopants and then thermally annealed such that the dopants diffuse into sub-collector region 270. The forming of sub-collector region 270 and collector region 272 can occur before, during, or after the process steps disclosed herein where applicable. It is also understood that the dopant materials can be switched out for materials with different polarities to create, e.g., sub-emitter and emitter regions with respective concentrations of dopants.

An interface between substrate 10 and dielectric material 255 can include a substantially sloped sidewall profile which defines different-sized surface areas. The substantially sloped sidewall profile of substrate 10 can be formed during the selective removing of portions of substrate 10 and first and second semiconductor layers 30, 40 to undercut crystalline base layer 20. Specifically, a portion of dielectric material 255 can include a first surface area adjacent to extrinsic base region 180 of crystalline base layer 20 and an opposing second surface area adjacent to substrate 10. Processes of forming IC structure 250, including the selective etching and other removal processes discussed herein, can cause the first surface area adjacent to crystalline base layer 20 to be greater in size than the second surface area adjacent to substrate 10. This difference in surface area can increase the length of extrinsic base region 180 while independently reducing the parasitic capacitance of substrate 10 (i.e., by reducing the contact area between substrate 10 and crystalline base layer 20).

IC structure 250 can function as a bipolar transistor when applied as part of a larger integrated circuit or electrical device. Substrate 10 of IC structure 250 can function as either the emitter or the collector of the bipolar transistor by being electrically coupled to crystalline base layer 20. Crystalline base layer 20, including both intrinsic base region 120 and extrinsic base region 180, can function as the base of the bipolar transistor. First and second semiconductor layers 30, 40, together can function as the complementary emitter or collector to substrate 10. In particular, the interface between crystalline base layer 20 and its adjacent components forms an electrical heterojunction between different materials. IC structures 250 with the characteristics set out herein reduce the parasitic resistance and capacitance of a bipolar transistor, such that the transistor can be applied operably in applications where the frequency of an electric signal is equal to or in excess of five hundred GHz.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated circuit (IC) structure, the method comprising:
    a precursor structure on a substrate, wherein the precursor structure includes:
    a crystalline base layer,
    a first semiconductor layer positioned on the crystalline base layer, and
    a second semiconductor layer positioned on the first semiconductor layer;
    removing a portion of the substrate and the precursor structure to expose an underlying portion of the substrate beneath the precursor structure;
    forming a dielectric spacer on the precursor structure;
    selectively removing the first semiconductor layer, the second semiconductor layer, and the exposed portion of the substrate to undercut an exposed extrinsic base region of the crystalline base layer, wherein the selectively removing includes:
        removing the substrate before removing the dielectric spacer to form an isolation trench;
        removing the dielectric spacer,
        forming an oxide within the isolation trench up to the second semiconductor layer of the precursor structure, and
        selectively removing a portion of the second semiconductor layer; and
    growing the exposed extrinsic base region to have a greater thickness than an intrinsic base region of the crystalline base layer positioned between the substrate and the first semiconductor layer.

2. The method of claim 1, wherein the crystalline base layer comprises mono crystalline silicon germanium (SiGe).

3. The method of claim 1, further comprising forming a dielectric film on each of the exposed portion of the substrate, the exposed extrinsic base region of the crystalline base layer, the first semiconductor layer, and the second semiconductor layer, before the growing of the extrinsic base region.

4. The method of claim 3, further comprising forming an oxide between the substrate and the exposed extrinsic base region undercut from the selective removing, after the forming of the dielectric film.

5. The method of claim 1, further comprising forming a sacrificial cap layer on the second semiconductor layer, and removing the sacrificial cap layer after the growing of the exposed extrinsic base region.

6. The method of claim 1, further comprising forming a silicide contact on each of the substrate, the exposed extrinsic base region of the crystalline base structure, and the second semiconductor layer, after the growing of the exposed extrinsic base region.

7. The method of claim 1, further comprising doping the substrate and the second semiconductor layer, wherein the doping of the substrate forms one of an emitter and a collector of a bipolar transistor, and the doping of the second semiconductor layer forms the other of the emitter and the collector of the bipolar transistor.

8. A method of forming an integrated circuit (IC) structure, the method comprising:
    forming a precursor structure on a substrate, wherein the precursor structure includes:
    a crystalline base layer,
    a first semiconductor layer positioned on the crystalline base layer, and
    a second semiconductor layer positioned on the first semiconductor layer;
    removing portions of the substrate and the precursor structure to expose two underlying portions of the substrate beneath the precursor structure;
    forming a dielectric spacer on the precursor structure;
    selectively removing the first semiconductor layer, the second semiconductor layer, and the exposed two portions of the substrate to undercut two exposed extrinsic base regions of the crystalline base layer, wherein the selectively removing includes:
        removing the substrate before removing the dielectric spacer to form an isolation trench;

removing the dielectric spacer,
forming an oxide within the isolation trench up to the second semiconductor layer of the precursor structure, and
selectively removing a portion of the second semiconductor layer; and
growing the two exposed extrinsic base regions to have a greater thickness than an intrinsic base region of the crystalline base layer positioned between the substrate and the first semiconductor layer and between the two exposed extrinsic base regions.

9. The method of claim 8, further comprising doping the substrate and the second semiconductor layer, wherein the doping of the substrate forms one of an emitter and a collector of a bipolar transistor, and the doping of the second semiconductor layer forms the other of the emitter and the collector of the bipolar transistor.

\* \* \* \* \*